United States Patent
Kim

(10) Patent No.: US 7,609,571 B2
(45) Date of Patent: Oct. 27, 2009

(54) SEMICONDUCTOR MEMORY DEVICE HAVING A CONTROL UNIT RECEIVING A SENSING BLOCK SELECTION ADDRESS SIGNAL AND RELATED METHOD

(75) Inventor: Doo-Gon Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 89 days.

(21) Appl. No.: 11/830,905

(22) Filed: Jul. 31, 2007

(65) Prior Publication Data

US 2008/0117699 A1 May 22, 2008

(30) Foreign Application Priority Data

Nov. 17, 2006  (KR) ...................... 10-2006-0113999

(51) Int. Cl.
*G11C 7/02* (2006.01)
(52) U.S. Cl. .................. 365/205; 365/203; 365/230.03
(58) Field of Classification Search ................ 365/205, 365/203, 230.03
See application file for complete search history.

(56) References Cited

U.S. PATENT DOCUMENTS

| | | | |
|---|---|---|---|
| 6,314,045 B1 * | 11/2001 | Ikeda | ................... 365/230.03 |
| 6,567,330 B2 | 5/2003 | Fujita et al. | |
| 6,661,714 B2 * | 12/2003 | Lee | ........................ 365/189.11 |
| 6,882,008 B1 | 4/2005 | Ohsawa | |
| 7,352,646 B2 * | 4/2008 | Choi et al. | ............. 365/230.03 |
| 2005/0068807 A1 | 3/2005 | Ohsawa | |
| 2007/0189068 A1 * | 8/2007 | Lee | ........................ 365/185.2 |
| 2008/0101114 A1 * | 5/2008 | Kim et al. | ................... 365/174 |

FOREIGN PATENT DOCUMENTS

| | | |
|---|---|---|
| JP | 2004119457 | 4/2004 |
| KR | 101998037818 A | 8/1998 |
| KR | 1020040059014 A | 7/2004 |
| KR | 1020040096781 A | 11/2004 |
| KR | 1020060105838 A | 10/2006 |

* cited by examiner

*Primary Examiner*—Tuan T Nguyen
*Assistant Examiner*—Hien N Nguyen
(74) *Attorney, Agent, or Firm*—Volentine & Whitt, PLLC

(57) ABSTRACT

Embodiments of the invention include a semiconductor memory device and a method for operating the semiconductor memory device. The invention includes a semiconductor memory device comprising a memory cell array block including a plurality of first memory cells connected to a plurality of first bit lines and a plurality of second memory cells connected to a plurality of second bit lines. The semiconductor memory device further includes a first sensing block disposed on a first side of the memory cell array block, a second sensing block disposed on a second side of the memory cell array block, and a control unit receiving a sensing block selection address signal, wherein, when the sensing block selection address signal specifies the first sensing block, the control unit enables the first sensing block and disables the second sensing block.

22 Claims, 6 Drawing Sheets

SEMICONDUCTOR MEMORY DEVICE HAVING A CONTROL UNIT RECEIVING A SENSING BLOCK SELECTION ADDRESS SIGNAL AND RELATED METHOD

CROSS-REFERENCE TO RELATED APPLICATION

This application claims priority to Korean Patent Application No. 2006-0113999, filed Nov. 17, 2006, the subject matter of which is hereby incorporated by reference in its entirety.

BACKGROUND OF THE INVENTION

1. Field of the Invention

Embodiments of the invention relate to a semiconductor memory device and a related method. In particular, embodiments of the invention relate to a semiconductor memory device comprising a control unit receiving a sensing block selection address signal and a method for operating the semiconductor memory device.

2. Description of Related Art

In a conventional semiconductor memory device, a memory cell array includes a plurality of memory cell array blocks and a plurality of sensing blocks. Each memory cell array block is located between two of the sensing blocks. In addition, each of the memory cell array blocks includes a plurality of memory cells, wherein each memory cell is connected to a word line of a plurality of word lines and a bit line of a plurality of bit line pairs. Each memory cell of the plurality of memory cells includes one capacitor and one transistor.

FIG. 1 illustrates the configuration of a conventional semiconductor memory device. The semiconductor memory device of FIG. 1 comprises a memory cell array 100 including i memory cell array blocks BK1 to BKi and (i+1) sensing blocks SA1, SA12, SA23 . . . SA(i-1)i, SAi (i.e., sensing blocks SA1 to SAi). Memory cell array 100 further comprises a row decoder 110, a column decoder 120, and a control unit 130. Each of memory cell array blocks BK1 to BKi includes a plurality of memory cells MC. Each memory cell MC is connected to a word line of word lines (WL11 to WL1k), (WL21 to WL2k), . . . , (WLi1 to WLik). Each memory cell MC is also connected to a bit line of bit line pairs (BL1, BL1B), (BL2, BL2B), (BL3, BL3B), . . . . That is, each memory cell MC is connected between a word line and a bit line. Each of memory cells MC includes an NMOS transistor N and a capacitor C.

In addition, each of sensing blocks SA1 to SAi includes a plurality of sense amplifying units. For example, sensing block SA1 includes sense amplifying units (SA1-1, . . . ), sensing block SA12 includes sense amplifying units (SA12-1, SA12-2, . . . ), and sensing block SAi includes sense amplifying units (SAi-1, . . . ). Although they are not all illustrated in detail, each of the sense amplifying units of the semiconductor memory device of FIG. 1 are substantially the same. Each sense amplifying unit includes bit line isolation gates ISOG1 and ISOG2, a precharge circuit PRE, a bit line sense amplifier BSA, and a column select gate CSG. Each of bit line isolation gates ISOG1 and ISOG2 includes NMOS transistors N1 and N2. In addition, precharge circuit PRE includes NMOS transistors N3, N4, and N5. Also, bit line sense amplifier BSA includes a PMOS sense amplifier including PMOS transistors P1 and P2 and an NMOS sense amplifier including NMOS transistors N6 and N7. Column select gate CSG includes NMOS transistors N8 and N9.

Functions of blocks of the semiconductor memory device illustrated in FIG. 1 will now be described.

In each of memory cell array blocks BK1 to BKi, data is written to or read from a memory cell MC connected between a selected one of word lines (WL11 to WL1k), . . . , (WLi1 to WLik) and a bit line of a selected pair of the bit line pairs. Row decoder 110 decodes a first row address RA1 to select a word line from the plurality of word lines in response to an active command ACT. Column decoder 120 decodes a column address CA to enable a column select signal on one of a plurality of column select signal lines CSL1 to CSLn in response to a write command WR or a read command RD. Control unit 130 decodes a second row address RA2 specifying one of memory cell array blocks BK1 to BKi to select a memory cell array block in response to active command ACT. In addition, during a precharge operation, control unit 130 enables bit line isolation control signals ISO1 and ISO2 and a precharge control signal CPRE of control signal groups CON1 to CONi for sensing blocks SA1 to SAi, respectively. Also, in response to write command WR during a write operation and in response to a read command RD during a read operation, control unit 130 enables sense amplifier enable signals LA and LAB provided to a sensing block disposed on the left side of the selected memory cell array block and enables sense amplifier enable signals LA and LAB provided to a sensing block disposed on the right side of the selected memory cell array block. For example, during the write or read operation, when memory cell array block BK1 is selected, sense amplifier enable signals LA and LAB of control signal group CON1 for sensing block SA1 and sense amplifier enable signals LA and LAB of control signal group CON12 for sensing block SA12 are enabled to operate all of the bit line sense amplifiers in sensing blocks SA1 and SA12 to amplify respective voltage differences between the bit lines of bit line pairs (BL1, BL1B), (BL2, BL2B), (BL3, BL3B), . . . , in order to amplify a voltage difference between the bit lines of one of those bit line pairs.

In the memory cell array of the conventional semiconductor memory device shown in FIG. 1, when one of the memory cell array blocks is specified by second row address RA2, all of the bit line sense amplifiers of the sensing block disposed on the left side and all of the bit line sense amplifiers of the sensing block disposed on the right side of the specified memory cell array block are enabled to amplify respective voltage differences between bit lines of each of the bit line pairs. Accordingly, the data on each bit line pair of the specified memory cell array block is amplified.

However, as the storage capacity and degree of integration of semiconductor memory devices increase, the distance (i.e., interval) between bit lines decreases, so coupling noise may be generated due to coupling capacitance between adjacent bit lines. In addition, data apparent on the bit lines may be changed by the coupling noise.

Referring to FIG. 1, when a voltage apparent on bit line BL2 transitions to a logic high level and respective voltages apparent on adjacent inverted bit lines BL1B and BL2B each transition to a logic low level, coupling noise is generated due to bit line coupling capacitance. The coupling noise may decrease the voltage level apparent on bit line BL2 and increase the respective voltage levels apparent on inverted bit lines BL1B and BL2B, which may change the data on bit lines BL2, BL1B, and BL2B.

Recently, memory cells having no capacitor have been developed for semiconductor memory devices having a relatively high degree of integration. In a semiconductor memory device having such memory cells, the interval between bit lines is smaller than that in the conventional semiconductor memory device illustrated in FIG. 1. Dynamic memory cells having no capacitor are disclosed in U.S. Patent Publication No. 2005/0068807, U.S. Pat. No. 6,567,330, U.S. Pat. No. 6,882,008, etc.

SUMMARY OF THE INVENTION

Embodiments of the invention provide a semiconductor memory device that may provide reduced coupling capacitance between bit lines and a method for operating the semiconductor memory device.

In one embodiment, the invention provides a semiconductor memory device comprising a memory cell array block comprising a plurality of first memory cells connected to a plurality of first bit lines and a plurality of second memory cells connected to a plurality of second bit lines. The semiconductor memory device further comprises a first sensing block disposed on a first side of the memory cell array block, wherein, when enabled, the first sensing block performs a first sensing operation to amplify a voltage difference between a pair of the first bit lines and between a pair of first sense bit lines corresponding to the pair of the first bit lines. The semiconductor memory device still further comprises a second sensing block disposed on a second side of the memory cell array block, wherein, when enabled, the second sensing block performs a second sensing operation to amplify a voltage difference between a pair of the second bit lines and between a pair of second sense bit lines corresponding to the pair of second bit lines. In addition, the semiconductor memory device comprises a control unit receiving a sensing block selection address signal, wherein, when the sensing block selection address signal specifies the first sensing block, the control unit enables the first sensing block and disables the second sensing block.

In another embodiment, the invention provides a semiconductor memory device comprising a plurality of sensing blocks; a plurality of memory cell array blocks respectively disposed between pairs of adjacent sensing blocks of the plurality of sensing blocks, wherein each memory cell array block comprises a plurality of first memory cells connected to a plurality of first bit lines and a plurality of second memory cells connected to a plurality of second bit lines; and a control unit receiving a sensing block selection address signal. In addition, the plurality of sensing blocks comprises a first sensing block disposed on a first side of a selected memory cell array block of the plurality of memory cell array blocks and a second sensing block disposed on a second side of the selected memory cell array block. Also, when the sensing block selection address signal specifies the first sensing block, the control unit enables the first sensing block and disables the second sensing block. Additionally, the first sensing block is connected to the first memory cells of the selected memory cell array block, and the second sensing block is connected to the second memory cells of the selected memory cell array block.

In yet another embodiment, the invention provides a method for operating a semiconductor memory device comprising a memory cell array block, wherein the memory cell array block comprises a plurality of first memory cells connected to a plurality of first bit lines and a plurality of second memory cells connected to a plurality of second bit lines. The method comprises disabling a first sensing block corresponding to the first bit lines and disposed on a first side of the memory cell array block to prevent the first sensing block from performing a first sensing operation for any of the first bit lines, and enabling a second sensing block corresponding to the second bit lines and disposed on a second side of the memory cell array block to perform a second sensing operation for at least one of the second bit lines while the first sensing block is disabled.

BRIEF DESCRIPTION OF THE DRAWINGS

Embodiments of the invention will be described herein with reference to the accompanying drawings, in which.

DESCRIPTION OF EMBODIMENTS

Figure 1:
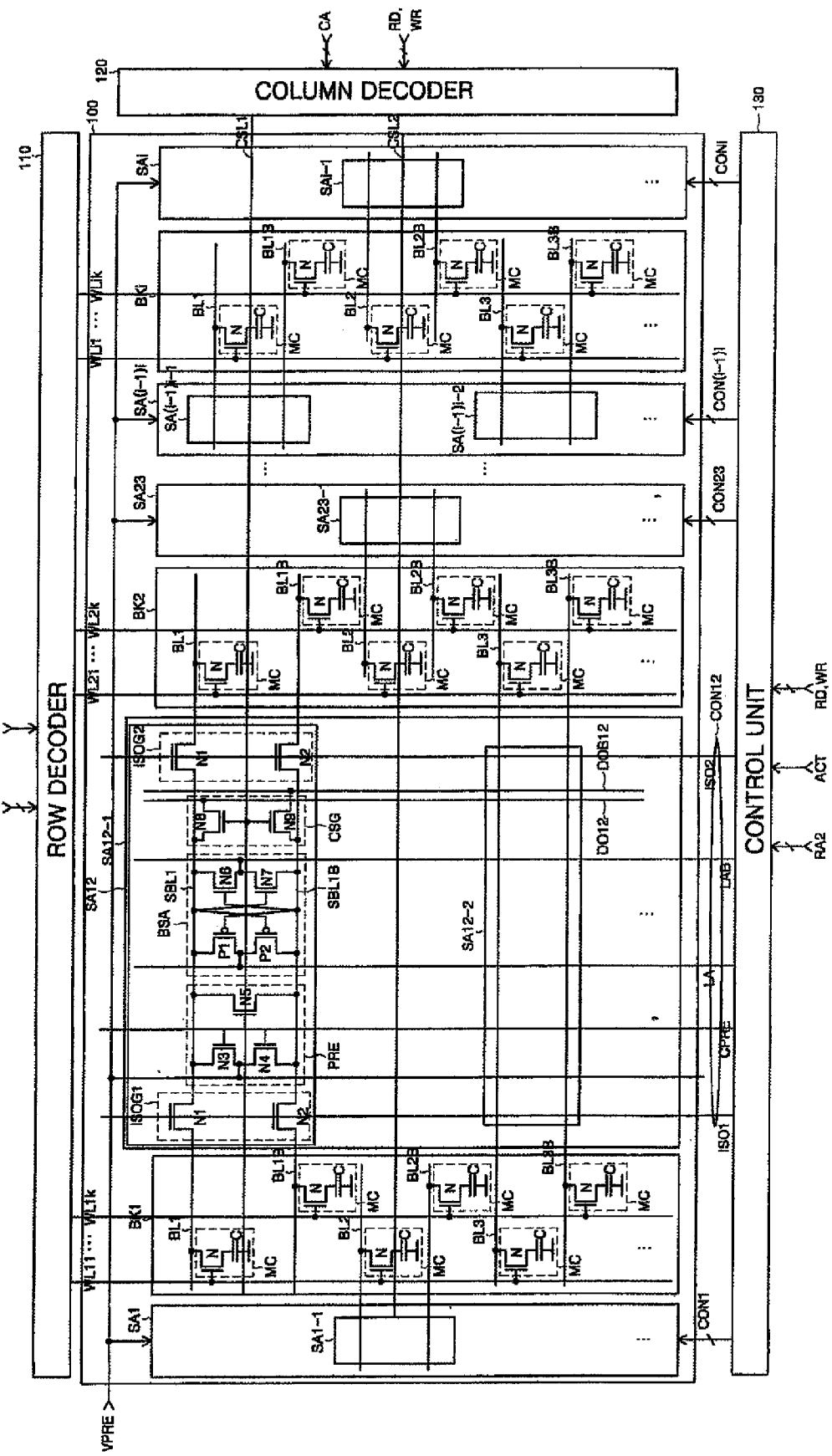
FIG. 1 illustrates the configuration of a conventional semiconductor memory device.

In the drawings, like reference symbols indicate like or similar elements throughout. In addition, the drawings are not necessarily to scale.

Figure 2:
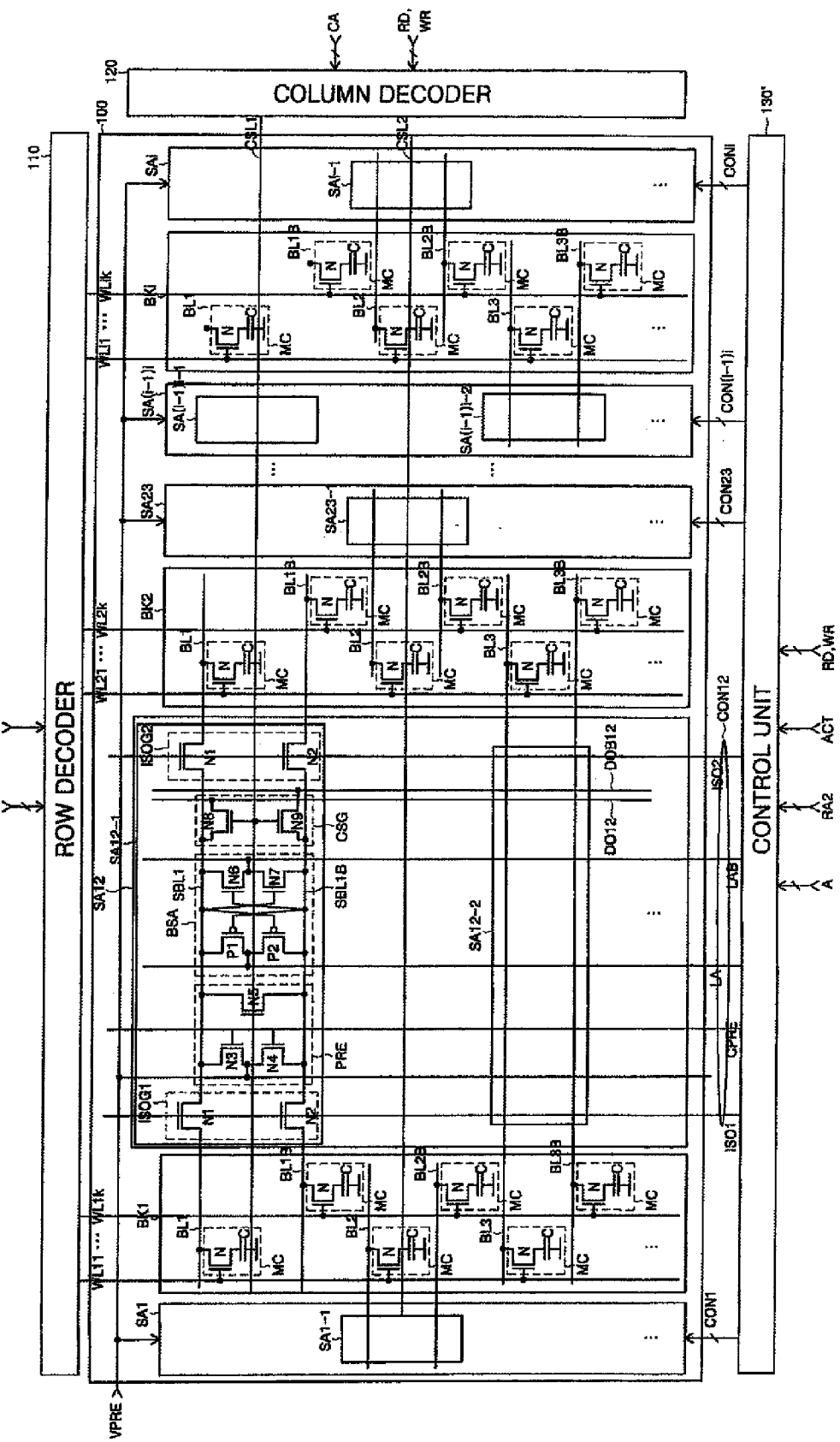
FIG. 2 illustrates the configuration of a semiconductor memory device in accordance with an embodiment of the invention.

FIG. 2 illustrates the configuration of a semiconductor memory device in accordance with an embodiment of the invention. In FIGS. 1 and 2, like reference symbols indicate like components. In addition, blocks in FIGS. 1 and 2 that have the same reference symbol also have the same function. Thus, the description of those blocks will be omitted in the description of the semiconductor memory device of FIG. 2.

The semiconductor memory device illustrated in FIG. 2 comprises a control unit 130' instead of control unit 130 of FIG. 1. Functions of control unit 130' will be described below with reference to FIG. 2.

In response to an active command ACT, control unit 130' decodes a second row address RA2 specifying a memory cell array block to select a memory cell array block BKe from among memory cell array blocks BK1 to BKi. During a precharge operation, control unit 130' enables bit line isolation control signals ISO1 and ISO2 and a precharge control signal CPRE of each of control signal groups CON1 to CONi for sensing blocks SA1 to SAi. That is, reference symbols CON1 to CONi each represent a group of control signals. In the embodiment illustrated in FIG. 2, control signal group CON1, for example, comprises isolation control signals ISO1 and ISO2 and precharge control signal CPRE and is provided to sensing block SA1.

During a write or read operation, in response to a sensing block selection address signal A and either a write command WR (during a write operation) or a read command RD (during a read operation), control unit 130' enables sense amplifier enable signals LA and LAB among the control signals for either a sensing block disposed on the left side of the selected memory cell array block or a sensing block disposed on the right side of the selected memory cell array block.

Sensing block selection address signal A specifies to control unit 130' whether to enable the sensing block on the left side of selected memory cell array block BKe or on the right side of selected memory cell array block BKe. Also, in the embodiment illustrated in FIG. 2, when a sensing block on a first side of a memory cell array block corresponds to even bit line pairs, a sensing block on a second side opposite the first side of the memory cell array block corresponds to odd bit line pairs. Thus, by specifying whether to enable the sensing block disposed on the left side of selected memory cell array block BKe or the sensing block disposed on the right side of selected memory cell array block BKe, sensing block selection address signal A also specifies whether to amplify respective voltage differences on odd bit line pairs or even bit line pairs. As used herein, when a sensing block selection address signal is said to "specify" a sensing block, it means that the sensing block selection address signal indicates whether to enable a sensing block on the left side of a selected memory cell array block or a sensing block on the right side of the selected memory cell array block.

In addition, enabling sense amplifier enable signals LA and LAB among the control signals of a sensing block may be referred to herein as "enabling" the sensing block. Also, disabling or, if they are already disabled, not enabling sense amplifier enable signals LA and LAB among the control signals of a sensing block may be referred to herein as "disabling" the sensing block. Also, as used herein, "not enabling" a signal includes maintaining the signal at a disabled state.

During an exemplary write or read operation, when, for example, memory cell array block BK1 is selected and sense amplifier enable signals LA and LAB of control signal group CON1 corresponding to sensing block SA1 are enabled in response to sensing block selection address signal A, all bit line sense amplifiers in sensing block SA1 operate to amplify respective voltage differences between bit lines of each of the even bit line pairs (BL2, BL2B), . . . . Sensing block SA1 is disposed on the left side of memory cell array block BK1.

Also, in the above example, sense amplifier enable signals LA and LAB of control signal group CON12 for sensing block SA12 disposed on the right side of memory cell array block BK1 are disabled so that each bit line of the odd bit line pairs (BL1, BL1B), (BL3, BL3B), . . . maintains a precharge voltage level VPRE received during a precharge operation performed prior to the write or read operation. That is, in the example described above, memory cell array block BK1 is selected, sensing block SA1 is enabled, and sensing block SA12 is disabled.

In this manner, in a semiconductor memory device in accordance with an embodiment of the invention, when a voltage apparent on bit line BL2 transitions to a logic high level, respective voltages apparent on an adjacent inverted bit line BL1B and an adjacent bit line BL3 (i.e., adjacent to inverted bit line BL2B) do not transition to a logic high level or a logic low level, but remain at a precharge voltage level VPRE, which may reduce coupling noise caused by coupling capacitance.

In the embodiment illustrated in FIG. 2, when the respective voltage levels apparent on bit lines of the even bit line pairs transition, the respective voltages apparent on bit lines of the odd bit line pairs remain at precharge voltage level VPRE, and when the respective voltage levels apparent on bit lines of the odd bit line pairs transition, the respective voltages apparent on bit lines of the even bit line pairs remain at precharge voltage level VPRE. Thus, coupling noise caused by coupling capacitance between adjacent bit line pairs may be reduced.

Although the bit lines of the semiconductor memory device illustrated in FIG. 2 are arranged in a folded bit line structure, a semiconductor memory device in accordance with an embodiment of the invention having an open bit line structure may be operated in a manner similar to the manner in which the semiconductor memory device illustrated in FIG. 2 is operated.

Figure 3:
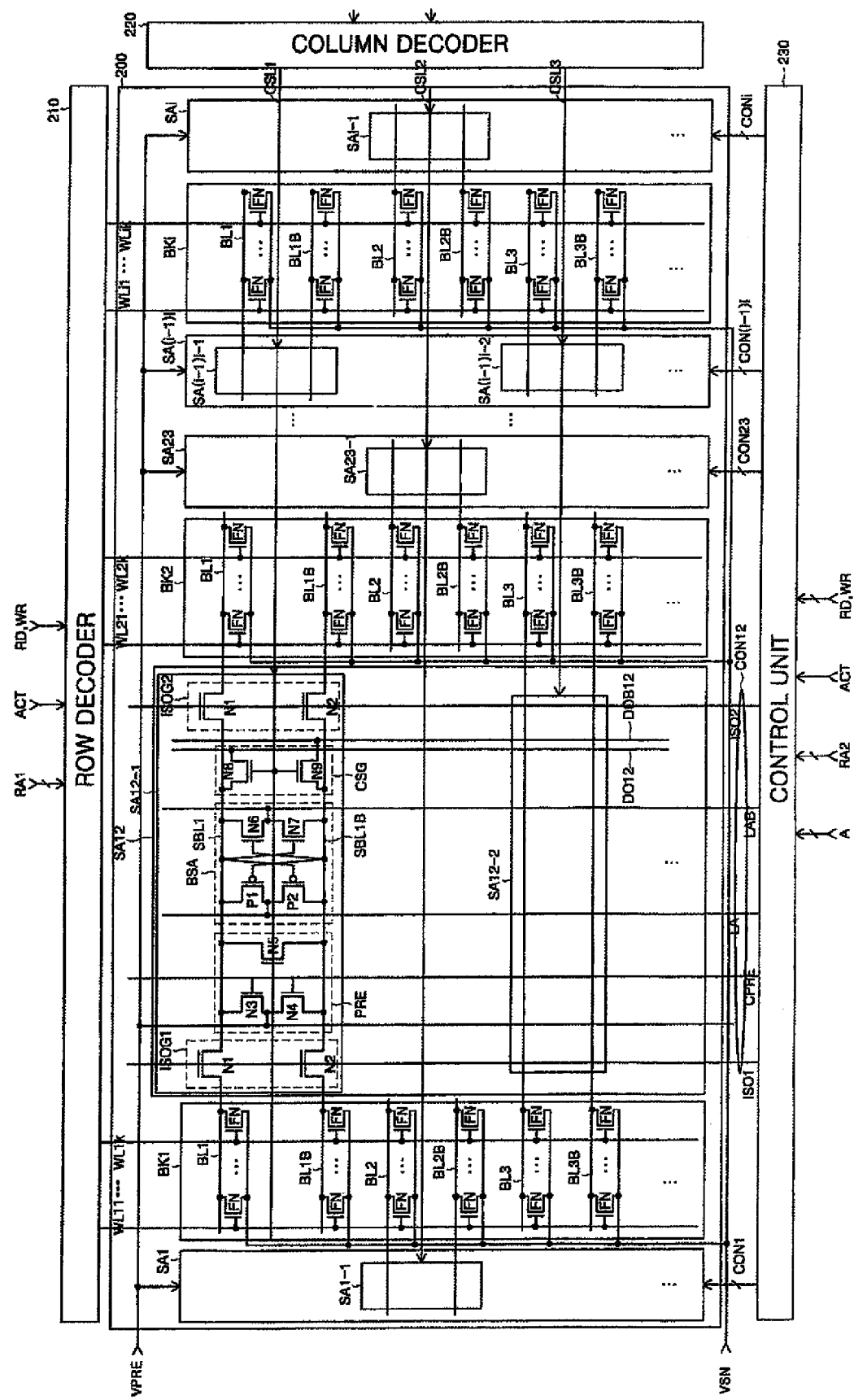
FIG. 3 illustrates the configuration of a semiconductor memory device in accordance with another embodiment of the invention.

FIG. 3 illustrates the configuration of a semiconductor memory device in accordance with another embodiment of the invention. The semiconductor memory device illustrated in FIG. 3 comprises a memory cell array 200, a row decoder 210, a column decoder 220, and a control unit 230. Memory cell array 200 comprises i memory cell array blocks BK1 to BKi and (i+1) sensing blocks SA1, SA12, SA23, . . . , SAi. Each of sensing blocks SA1 to SAi comprises a plurality of sense amplifying units. For example, sensing block SA1 comprises sense amplifying units (SA1-1, . . . ), and sensing block SA12 comprises sense amplifying units (SA12-1, SA12-2, . . . ). Each of the sense amplifying units comprises bit line isolation gates ISOG1 and ISOG2, a bit line sense amplifier BSA, a column select gate CSG, and a precharge circuit PRE. Memory cell array 200 further comprises pluralities of word lines (WL11 to WL1$k$) . . . , (WLi1 to WLik) corresponding to memory cell array blocks BK1 to BKi, respectively. In addition, memory cell array 200 comprises a plurality of bit line pairs (BL1, BL1B), (BL2, BL2B), . . . . Although they are not all illustrated in detail, all of the sense amplifying units of the semiconductor memory device of FIG. 3 are substantially the same, so each of the sense amplifying units in FIG. 3 is similar to sense amplifier unit SA12-1 of FIG. 3.

Each of bit line isolation gates ISOG1 and ISOG2 comprises NMOS transistors N1 and N2. Each of the i memory cell array blocks BK1 to BKi comprises a plurality of memory cells FN. In addition, each memory cell FN is connected to a bit line and a word line corresponding to the memory cell array block in which the memory cell FN is disposed. For example, a memory cell FN disposed in memory cell array block BK1 is connected between a word line of word lines (WL11 to WL1$k$) and a bit line of bit line pairs (BL1, BL1B), (BL2, BL2B), . . . . Each of memory cells FN comprises a transistor having a floating body, and does not comprise a capacitor. Each memory cell FN of the plurality of memory cells FN has a first electrode (i.e., a drain) connected to a bit line among bit line pairs (BL1, BL1B), (BL2, BL2B), . . . , a second electrode (i.e, a source) that receives a common source voltage VSN, and a gate connected to a word line among word lines (WL11 to WL1$k$), . . . , (WLi1 to WLik). In the embodiment illustrated in FIG. 3, the respective second electrodes (i.e., sources) of each of the memory cells FN are commonly connected. In the semiconductor memory device illustrated in FIG. 3, the bit line pairs are arranged in the folded bit line structure.

Functions of blocks illustrated in FIG. 3 will now be described. In addition, as used herein, when a memory cell is said to be "connected between" a word line and a bit line, it means that one terminal of the memory cell is connected to the word line and another terminal of the memory cell is connected to the bit line.

In memory cell array 200, data can be written to and read from a pair of memory cells wherein a first memory cell of the pair is connected between a selected word line and a first bit line of a bit line pair selected by a column select signal and a second memory cell of the pair is connected between the selected word line and a second bit line of the bit line pair. For a pair of memory cells in memory cell array block BK1, depending on which bit lines the memory cells are connected to, the data to be written to the pair of memory cells is transferred to the memory cells via either a data input/output line pair DO1 and DOB1 (not shown) disposed on the left side of memory cell array block BK1 or a data input/output line pair DO12 and DOB12 disposed on the right side of memory cell array block BK1. In addition, for a pair of memory cells in memory cell array block BK1, depending on which bit lines the memory cells are connected to, data read from the pair of memory cells is read (i.e., output) via data input/output line pair DO1 and DOB1 or data input/output line pair DO12 and DOB12. For a single pair of memory cells, data is input to and output from that pair of memory cells via the same data input/output line pair. In addition, data is input to and output from each of memory cell array blocks BK2 to BKi in a manner analogous to the manner described above with reference to memory cell array block BK1. When an active command ACT is applied, row decoder 210 decodes a first row address RA1 to enable a word line select signal to select one of word lines WL11 to WL1k, . . . , WLi1 to WLik. In addition, when a read command RD or a write command WR is applied, column decoder 220 decodes a column address CA to generate column select signals to select (i.e., enable a signal on) a column select signal line of column select signal lines CSL1 to CSLn.

During a precharge operation, control unit 230 enables the bit line isolation control signals ISO1 and ISO2 of each of control signal groups CON1 to CONi.

During a write or read operation, a second row address RA2 specifies a selected memory cell array block BKe of memory cell array blocks BK1 to BKi, and a sensing block address signal A specifies either a sensing block disposed on the left side of memory cell array block BKe or a sensing block disposed on the right side of selected memory cell array block BKe. Thus, in response to second row address RA2 and sensing block selection address signal A, control unit 230 enables either a sensing block disposed on the left side of selected memory cell array block BKe or a sensing block disposed on the right side of selected memory cell array block BKe. That is, control unit 230 enables sense amplifier enable control signals LA and LAB of the control signal group applied to the sensing block specified by sensing block selection address signal A. By specifying whether to enable a sensing block disposed on the right side of selected memory cell array block BKe or a sensing block disposed on the left side of selected memory cell array block BKe, sensing block address signal A also specifies whether to amplify respective voltage differences on odd bit line pairs or even bit line pairs.

In the embodiment illustrated in FIG. 3, during a read or write operation, either bit line sense amplifiers BSA in the sensing block disposed on the left side of the selected memory cell array block BKe operate while bit line sense amplifiers BSA in the sensing block disposed on the right side of the selected memory cell array block BKe do not operate, or bit line sense amplifiers BSA in the sensing block disposed on the right side of the selected memory cell array block BKe operate while bit line sense amplifiers BSA in the sensing block disposed on the left side of the selected memory cell array block BKe do not operate. For example, in an exemplary operation, bit line sense amplifiers BSA in the sensing block disposed on the left side of a selected memory cell array block BKe operate to amplify data on even bit line pairs (BL2, BL2B), . . . while bit line sense amplifiers BSA in the sensing block disposed on the right side of selected memory cell array block BKe do not operate, and respective voltage levels apparent on bit lines of odd bit line pairs (BL1, BL1B), (BL3, BL3B), . . . remain at precharge voltage level VPRE. When a sensing block is enabled, the bit line sense amplifiers BSA in that sensing block are enabled and operate (i.e., amplify a voltage difference apparent on the corresponding pair of sense bit lines). Also, when a sensing block is disabled, the bit line sense amplifiers BSA in that sensing block are disabled and do not operate.

As another example, when the specified memory cell array block BKe is memory cell array block BK1, in an exemplary operation, only the sense amplifier enable signals LA and LAB applied to sensing block SA1 disposed on the left side of memory cell array block BK1 are enabled, while sense amplifier enable signals LA and LAB applied to a sensing block SA12 disposed on the right side of memory cell array block BK1 are not enabled. Thus, data on even bit line pairs (BL2, BL2B), . . . of memory cell array block BK1 is amplified while the bit lines of odd bit line pairs (BL1, BL1B), (BL3, BL3B), . . . are kept at precharge voltage level VPRE. Thus, coupling noise caused by coupling capacitance between adjacent bit lines may be reduced.

Figure 4:
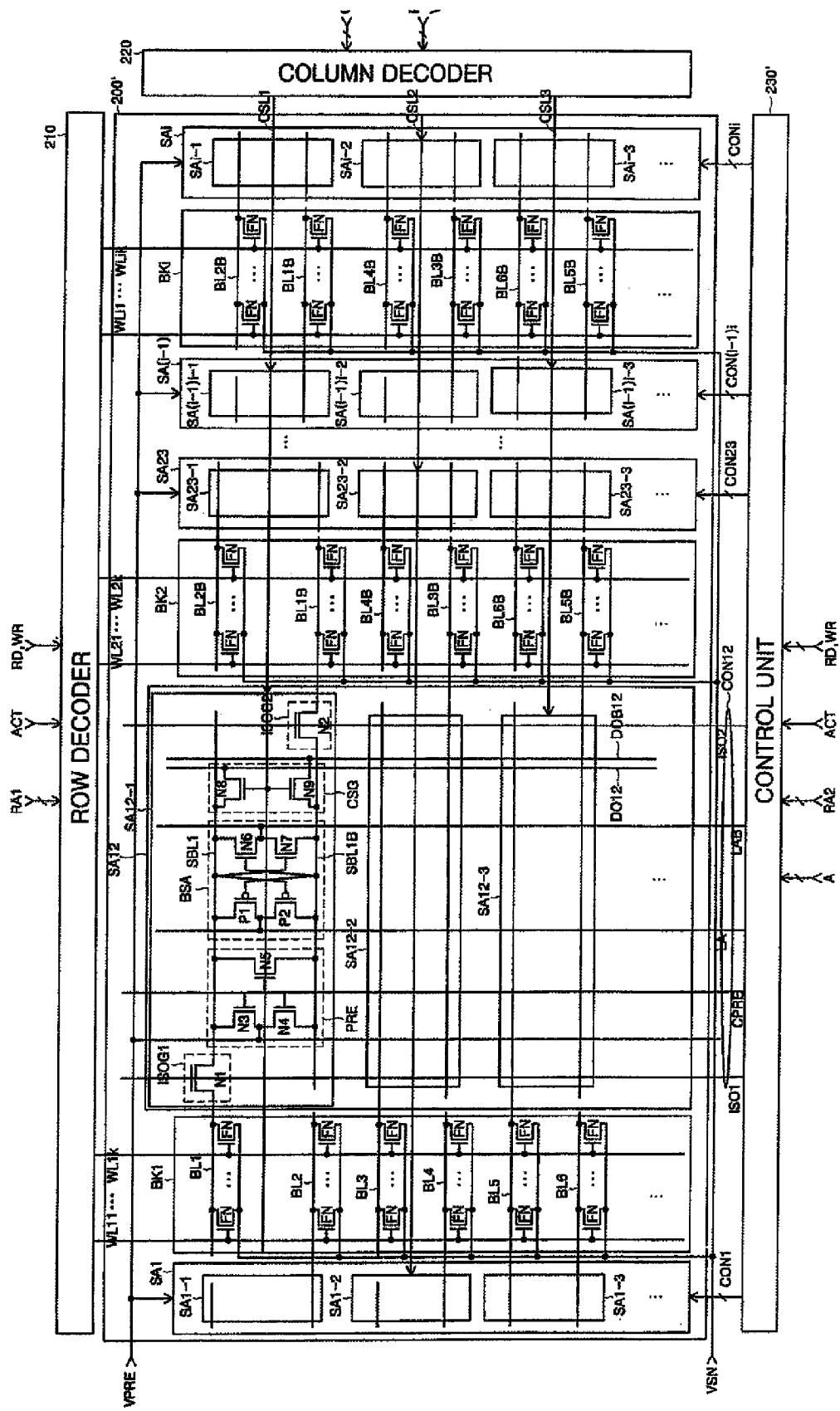
FIG. 4 illustrates the configuration of a semiconductor memory device in accordance with yet another embodiment of the invention.

FIG. 4 illustrates the configuration of a semiconductor memory device in accordance with yet another embodiment of the invention.

The semiconductor memory device of FIG. 4 is similar to the semiconductor memory device illustrated in FIG. 3. However, the semiconductor memory device of FIG. 4 comprises a memory cell array 200' and a control unit 230' rather than memory cell array 200 and control unit 230, respectively, of the semiconductor memory device of FIG. 3. In the semiconductor memory device illustrated in FIG. 4, the bit lines are arranged in the open bit line structure, whereas, in the semiconductor memory device illustrated in FIG. 3, the bit lines are arranged in the folded bit line structure. In the semiconductor device illustrated in FIG. 4, a bit line isolation gate ISOG1 comprises an NMOS transistor N1 and a bit line isolation gate ISOG2 comprises an NMOS transistor N2.

Like components of the semiconductor memory devices illustrated in FIGS. 3 and 4 have like functions, so description of their respective functions may not be repeated with reference to FIG. 4. Operation of the semiconductor memory device illustrated in FIG. 4 will be described below.

In the semiconductor memory device of FIG. 4, during a precharge operation, bit line isolation control signals ISO1 and ISO2 of each of control signal groups CON1 to CONi are enabled so that bit lines BL1, BL1B, BL2, BL2B, BL3, BL3B, . . . are precharged to precharge voltage level VPRE.

During a write or read operation, a second row address RA2 specifies a selected memory cell array block BKe of memory cell array blocks BK1 to BKi, and control unit 230' enables a sensing block disposed on the right side of selected memory cell array block BKe or a sensing block disposed on the left side of selected memory cell array block BKe in accordance with sensing block selection address signal A. That is, control unit 230' enables sense amplifier enable control signals LA and LAB of the control signals applied to the selected sensing block specified by control unit 230'. Because sensing block selection address signal A specifies whether to enable a sensing block on the left side or a sensing block on the right side of selected memory cell array block BKe, sensing block selection address signal A also specifies whether to amplify either respective voltage differences between odd bit lines and precharge voltage VPRE or respective voltage differences between even bit lines and precharge voltage VPRE.

As an example, in the embodiment illustrated in FIG. 4, when even bit lines are selected (i.e., when the sensing block disposed on the left side of a selected memory cell array block BKe is selected), only the bit line sense amplifiers BSA in the sensing block disposed on the left side of the specified block operate while bit line sense amplifiers BSA in the sensing block disposed on the right side of the specified block do not operate. Thus, data on even bit lines is amplified while voltages apparent on odd bit lines remain at precharge voltage level VPRE. For example, when memory cell array block BK1 is selected, data on even bit lines BL2, BL4 . . . is amplified while voltages apparent on odd bit lines BL1, BL3, . . . remain at precharge voltage level VPRE.

In another example, when odd bit lines are selected (i.e., when the sensing block disposed on the right side of a selected memory cell array block BKe is selected), only the bit line sense amplifiers BSA in the sensing block disposed on the right side of the specified block operate while bit line sense amplifiers BSA in the sensing block disposed on the left side of the specified block do not operate. Thus, data on odd bit lines is amplified while even bit lines maintain precharge voltage level VPRE. For example, when memory cell array block BK1 is selected, data on odd bit lines BL1, BL3, . . . is amplified while even bit lines BL2, BL4, . . . maintain precharge voltage level VPRE. Thus, coupling noise caused by coupling capacitance between adjacent bit lines may be reduced. In the embodiment illustrated in FIG. 4, bit line sense amplifiers BSA amplify a difference between a voltage level of data read from the memory cell FN and precharge voltage level VPRE.

FIG. 3 illustrates that a semiconductor memory device in accordance with an embodiment of the invention comprising memory cells FN may have individual sense amplifying units in each sensing block that have the same configuration as the individual sense amplifying units of the semiconductor memory device illustrated in FIG. 2. FIG. 4 illustrates that a semiconductor memory device in accordance with an embodiment of the invention comprising memory cells FN may have individual sense amplifying units in each sensing block that have a different configuration from that of the individual sense amplifying units of the semiconductor memory device illustrated in FIG. 2.

In the embodiment illustrated in FIG. 3, two memory cells FN disposed in a selected memory cell array block are connected to the same word line and respectively connected to the bit lines of a bit line pair. In the semiconductor memory device of FIG. 3, during a write operation, a data value "1" is stored in a first memory cell FN of the two memory cells FN and a data value "0" is stored in a second memory cell FN of the two memory cells FN. The threshold voltage of the memory cell FN storing the data value "1" is low and the threshold voltage of the memory cell FN storing the data value "0" is high. Accordingly, during a read operation, the memory cell FN storing the data value "1" allows more current to flow than the memory cell FN storing the data value "0." A voltage difference between the bit lines of the bit line pair is amplified by a corresponding bit line sense amplifier. Operation of memory cells FN, each of which has no capacitor, is performed by a known technique.

In the semiconductor memory device illustrated in FIG. 3, a respective one of memory cells FN is connected between each word line and each bit line of each pair of bit lines. However, in another embodiment, for each word line and one line of each bit line pair, only one memory cell FN is connected between the word line and one line of the bit line pair (see, e.g., FIG. 4).

When, for each word line, memory cells FN are respectively connected between the word line and only one bit line of each bit line pair, during a write operation, a data value "1" or a data value "0" is stored in a memory cell FN connected to one bit line of a bit line pair. In addition, the threshold voltage of a memory cell FN storing a data value "1" is low and the threshold voltage of a memory cell FN storing a data value "0" is high.

Accordingly, during a read operation, a memory cell FN storing the data value "1" allows more current to flow than a memory cell FN storing the data value "0" and a voltage apparent on the bit line to which memory cell FN storing the data value "1" is connected transitions to a voltage level higher than precharge voltage level VPRE. In addition, during a read operation, a memory cell FN storing the data value "0" allows less current to flow than a memory cell FN storing the data value "1" and a voltage apparent on the bit line to which memory cell FN storing the data value "0" is connected transitions to a voltage level lower than precharge voltage level VPRE. In the configuration descried above in which, for each word line, only one bit line of each bit line pair has a memory cell connected between it and the word line, a difference between the precharge voltage VPRE and a voltage apparent on either the bit line or the inverted bit line is amplified by the bit line sense amplifier.

In the semiconductor memory device illustrated in FIG. 3, memory cells FN may be arranged like memory cells MC of the semiconductor memory devices illustrated in FIGS. 1 and 2.

In the embodiments illustrated in FIGS. 3 and 4, memory cells FN have a common source to which the voltage VSN is applied. However, in a semiconductor memory device in accordance with an embodiment of the invention, memory cells FN do not need to have a common source.

Figure 5:
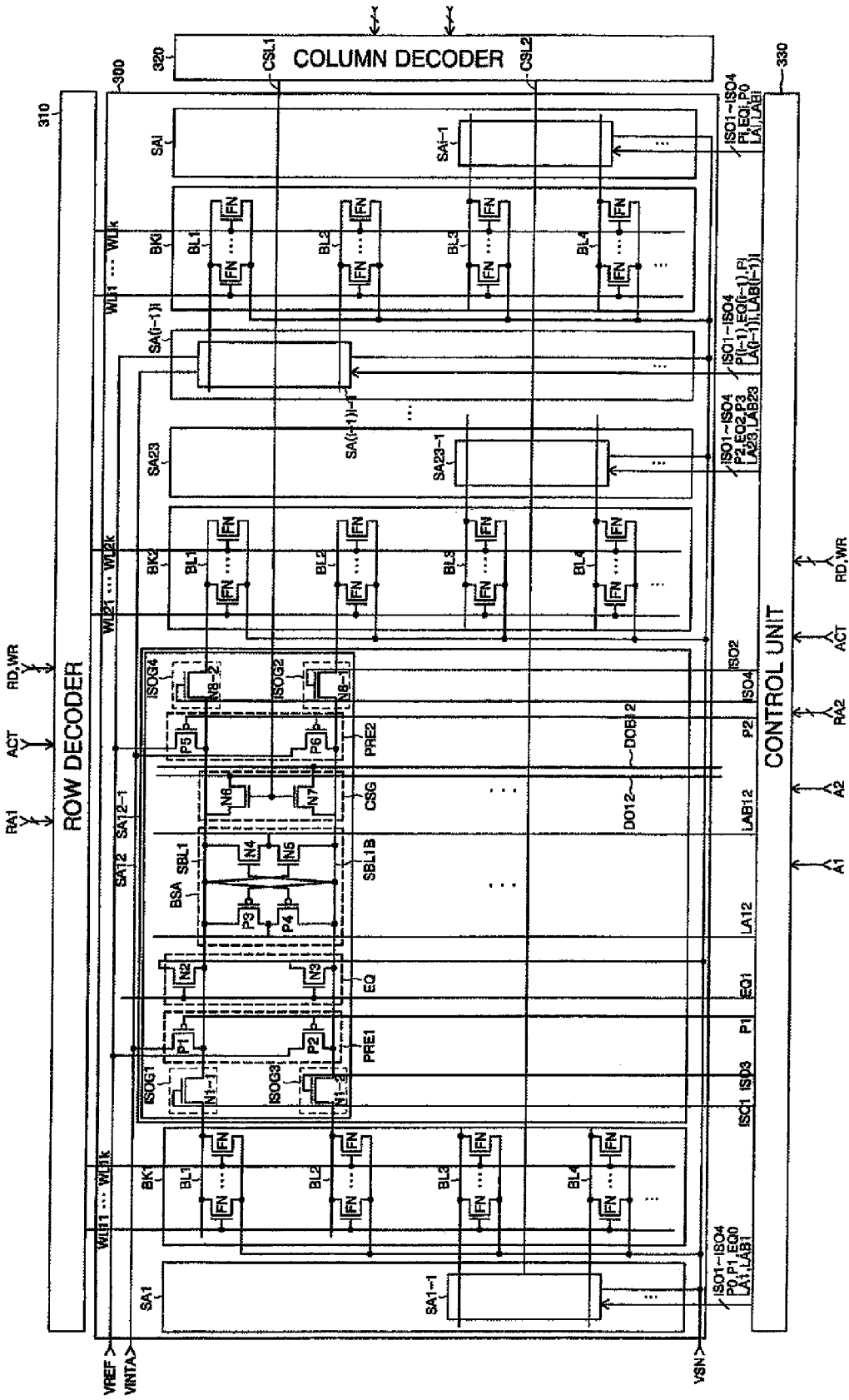
FIG. 5 illustrates the configuration of a semiconductor memory device in accordance with still another embodiment of the invention; and, FIG. 6 illustrates the configuration of a semiconductor memory device in accordance with still another embodiment of the invention.

FIG. 5 illustrates the configuration of a semiconductor memory device in accordance with an embodiment of the invention.

In FIG. 5, the semiconductor memory device comprises a memory cell array 300, a row decoder 310, a column decoder 320, and a control unit 330. Memory cell array 300 comprises i memory cell array blocks BK1 to BKi and (i+1) sensing blocks SA1, SA12, SA23, . . . , SAi.

Each of sensing blocks SA1 to SAi comprises a plurality of sense amplifying units. For example, sensing block SA1 comprises sense amplifying units (SA1-1, . . . ) and sensing block SAi comprises sense amplifying units (SAi-1, . . . ). Each sense amplifying unit comprises bit line isolation gates ISOG1 to ISOG4, a bit line sense amplifier BSA, a column select gate CSG, precharge circuits PRE1 and PRE2, and an equalization circuit EQ. Although they are not all illustrated in detail, the sense amplifying units of the semiconductor memory device illustrated in FIG. 5 are all substantially the same.

Bit line isolation gates ISOG1 to ISOG4 comprise NMOS transistors N1-1, N8-1, N1-2, and N8-2, respectively. Bit line sense amplifier BSA, precharge circuits PRE1 and PRE2, column select gate CSG, and equalization circuit EQ are configured as in the semiconductor memory device illustrated FIG. 2. Each of memory cell array blocks BK1 to BKi comprises a plurality of memory cells FN. Each memory cell FN has a floating body and is connected between a corresponding word line of word lines (WL11 to WL1k), . . . , (WLi1 to WLik) and a corresponding bit line of bit lines BL1, BL2, BL3, BL4, . . . . Each memory cell FN of the plurality of memory cells FN comprises a first electrode (i.e., a drain) connected to a corresponding bit line of bit lines BL1, BL2, BL3, BL4, . . . , a second electrode (i.e., a source) to which a common source voltage VSN is applied, and a gate connected to a corresponding word line of word lines (WL11 to WL1k), . . . , (WLi1 to WLik). In addition, in the semiconductor memory device illustrated in FIG. 5, all of the memory cells FN have a common source, and bit lines BL1, BL2, BL3, BL4, . . . are arranged in a folded bit line structure.

Functions of blocks illustrated in FIG. 5 will now be described.

In memory cell array 300, data can be written to and read from a selected memory cell FN connected between a selected word line and a bit line selected by a column select signal. In memory cell array block BK1, depending on which bit line a selected memory cell FN is connected to, data to be written to the selected memory cell FN is transferred to the selected memory cell FN via a data input/output line pair DO1 and DOB1 (not shown) disposed on the left side of memory cell array block BK1 (for example, when the selected memory cell FN is connected to bit line BL3) or via a data input/output line pair DO12 and DOB12 disposed on the right side of memory cell array block BK1 (for example, when the selected memory cell FN is connected to bit line BL2). Likewise, depending on which bit line the selected memory cell FN is connected to, data written to the selected memory cell FN may be read via data input/output line pair DO1 and DOB1 or via data input/output line pair DO12 and DOB12. Each of memory cell array blocks BK2 to BKi receives data and outputs data via a data input/output line pair disposed on the left side of the memory cell array block (i.e., for a first plurality of memory cells FN disposed in the memory cell array block) and via a data input/output line pair disposed on the right side of the memory cell array block (i.e., for a second plurality of memory cells FN disposed in the memory cell array block). As with memory cell array block BK1, for memory cells FN of memory cell array blocks BK2 to BKi, which data input/output line pair is used by a memory cell FN depends on which bit line the memory cell FN is connected to.

When an active command ACT is applied, row decoder 310 decodes a first row address RA1 to enable a word line select signal to select a word line from among word lines WL11 to WL1$k$, . . . , WLi1 to WLik. When a read command RD or a write command WR is applied, column decoder 320 decodes a column address CA to generate column select signals to select (i.e., enable a signal on) a column select signal line of column select signal lines CSL1 to CSLn. Also, when an active command ACT is applied, control unit 330 generates bit line isolation control signals ISO1 to ISO4, sense enable control signal pairs (LA1, LAB1), (LA12, LAB12), (LA23, LAB23), . . . , (LAi, LABi), equalization control signals EQ0 to EQi, and precharge control signals P0 to Pi in accordance with a second row address RA2 specifying a selected memory cell array block BKe among memory cell array blocks BK1 to BKi, a bit line selection address signal A1 specifying even bit lines or odd bit lines, and a sensing block selection address signal A2 specifying a sensing block disposed on the left side of selected memory cell array block BKe or a sensing block disposed on the right side of selected memory cell array block BKe.

Functions of the semiconductor memory device illustrated in FIG. 5 will now be described.

During an equalization operation, control unit 330 generates precharge control signals P0 to Pi having an internal voltage level VINTA, equalization control signals EQ0 to EQi having a high voltage level VPP, and bit line isolation control signals ISO1 to ISO4. Accordingly, PMOS transistors P1, P2, P5, and P6 of precharge circuits PRE1 and PRE2 are turned OFF, NMOS transistors N2 and N3 of equalization circuits EQ are turned ON, and NMOS transistors N1-1, N8-1, N1-2, and N8-2 of bit line isolation gates ISOG1 to ISOG4 are turned ON so that bit lines BL1, BL2, . . . and sense bit line pairs (SBL1, SBL1B), . . . are equalized to an equalization voltage level VSN.

An exemplary write operation subsequent to the equalization operation will now be described. In this exemplary write operation, second row address RA2 specifies memory cell array block BK1, bit line selection address signal A1 specifies the odd bit lines, and sensing block selection address signal A2 specifies sensing block SA1 disposed on the left side of memory cell array block BK1. In an exemplary write operation having the conditions described above, control unit 330 generates an equalization control signal EQ0 having a ground voltage level VSS and provides equalization control signal EQ0 to sensing block SA1. Control unit 330 also generates equalization control signals EQ1 to EQi each having a high voltage level VPP and provides those signals to sensing blocks SA12 to SAi, respectively. Accordingly, the equalization circuit EQ disposed on the left side of memory cell array block BK1 (i.e., disposed in sensing block SA1) is turned OFF. In addition, control unit 330 maintains bit line isolation control signals ISO1 to ISO4 at high voltage level VPP.

Row decoder 310 then decodes first row address RA1 to generate a select voltage VWL (=VSN+(Vth0+Vth1)/2 or a reference voltage VREF) to select a word line, and a word line select signal having a voltage level VSN (<VPP, <VREF, >VSS). In this exemplary operation, row decoder 310 selects word line WL11. In addition, Vth0 indicates the threshold voltage of a memory cell FN storing the data value "0", and Vth1 indicates the threshold voltage of a memory cell FN storing the data value "1.", Threshold voltage Vth0 is higher than threshold voltage Vth1.

Control unit 330 generates sense enable control signals LA1 and LAB1 having high voltage level VPP and low voltage level VSS, respectively, and provides them to sensing block SA1. In addition, column decoder 320 generates a column select signal CSL2 having high voltage level VPP in response to write command WR and column address CA.

Accordingly, column select gate CSG disposed in sensing block SA1 is turned ON to send on data line pair DO1 and DO1B (not shown), a data pair having a logic high level and a logic low level, for example, to sense bit line pair SBL1 and SBL1B, respectively, which are disposed in sensing block SA1. In addition, a bit line sense amplifier BSA disposed in sensing block SA1 operates to amplify the data pair sent to sense bit line pairs SBL1 and SBL1B disposed in sensing block SA1 to high voltage level VPP and ground voltage level VSS, respectively.

Since bit line isolation gate ISOG4 disposed in sense amplifying unit SA1-1 of sensing block SA1 is turned ON, the amplified voltage apparent on sense bit line SBL1 disposed in sensing block SA1 is provided to bit line BL3. In this case, since select voltage VWL is applied to the gate of a memory cell FN connected to bit line BL3 in memory cell array block BK1, a data value "1" is written to the memory cell FN. Though a data value "1" is provided to the memory cell FN in this exemplary operation, a data value "0" may be provided to the memory cell FN in another exemplary operation.

When the data value "1" is stored in the memory cell FN, the threshold voltage of the memory cell FN becomes Vth1. Alternatively, when the data value "0" is stored in the memory cell FN, the threshold voltage of the memory cell FN becomes Vth0.

During the exemplary write operation described above, in which memory cell array block BK1, the odd bit lines, and left sensing block SA1 are specified, right sensing block SA12 does not perform a sensing operation but maintains the voltages apparent on the sense bit lines corresponding to sensing block SA12 at equalization voltage level VSN (provided to those bit lines during the equalization operation) while sensing block SA1 disposed on the left side of memory cell array block BK1 performs the sensing operation. Thus, coupling noise caused by coupling capacitance between adjacent bit lines may be reduced.

An exemplary read operation of the semiconductor memory device illustrated in FIG. 5 will now be described.

An equalization operation is performed similarly to the equalization operation described above, which was performed during the write operation.

During a precharge operation, control unit 330 changes precharge control signal P0 applied to sensing block SA1 to a ground voltage level VSS, equalization control signal EQ0 to ground voltage level VSS, and bit line isolation control signals ISO0 to ISO4 to high voltage level VPP in response to a second row address RA2, a bit line selection addresses signal A1, and a sensing block selection address signal A2. Accordingly, precharge circuit PRE1 disposed in sensing block SA1 is turned ON, so a sense bit line SBL1 of sensing block SA1 and bit line BL3 receive an internal voltage level VINTA (<VPP, >VSN), and an inverted sense bit line SBL1B of sensing block SA1 receives a reference voltage level VREF (<VINTA, >VSN). That is, during the precharge operation, precharge circuit PRE1 operates to allow the data read line to have internal voltage level VINTA and the other line to have reference voltage level VREF.

During a first read operation, control unit 330 generates a precharge control signal P1 having an internal voltage level VINTA and maintains equalization control signal EQ0 at ground voltage level VSS. In addition, row decoder 310 decodes first row address RA1 to generate a word line select signal having a select voltage level VWL(=VSN+(Vth0+Vth1)/2 or VREF) to select a word line. In this exemplary read operation, word line WL11 is selected. When the data value "1" is stored in a memory cell FN connected between word line WL11 and bit line BL3, current flows since the select voltage level is higher than threshold voltage Vth1. Alternatively, when the data value "0", is stored in memory cell FN connected between word line WL11 and bit line BL3, current does not flow since the select voltage level is lower than threshold voltage Vth0. Accordingly, a voltage difference is generated between sense bit line pairs SBL1 and SBL1B, . . . , and is sensed by bit line sense amplifier BSA of sensing block SA1.

During a second read operation, control unit 330 generates a sense enable control signal LA1 having high voltage level VPP, a sense enable control signal LAB1 having ground voltage level VSS, and a bit line isolation control signal ISO4 having ground voltage level VSS. Accordingly, NMOS transistor N8-2 of bit line isolation gate ISOG4 disposed in sensing block SA1 is turned OFF, so bit line BL3 is separated from sense bit line SBL1. Further, the bit line sense amplifiers disposed in sensing block SA1 operate to amplify a voltage difference between sense bit line pairs (SBL1 and SBL1B), . . . so that the voltage apparent on one sense bit line is amplified to ground voltage level VSS and the voltage apparent on the other sense bit line is amplified to high voltage level VPP. Column decoder 320 then decodes column address CA to generate a column select signal CSL2 having high voltage level VPP, and accordingly, NMOS transistors N6 and N7 of column select gate CSG disposed in sensing block SA1 are turned ON to transfer a data pair apparent on sense bit line pair SBL1 and SBL1B disposed in sensing block SA1 to data line pairs DO1 and DO1B (not shown).

During the exemplary read operation described above, in which memory cell array block BK1, the odd bit lines, and left sensing block SA1 are specified, sensing block SA1 disposed on the left side of memory cell array block BK1 performs a sensing operation while sensing block SA12 disposed on the right side of memory cell array block BK1 does not perform a sensing operation but maintains the respective levels of the voltages apparent on the bit lines and the sense bit lines corresponding to sensing block SA12 at equalization voltage level VSN (provided to those lines during the equalization operation). Thus, as for the write operation, coupling noise caused by coupling capacitance between adjacent bit lines during the read operation may be reduced.

Figure 6:
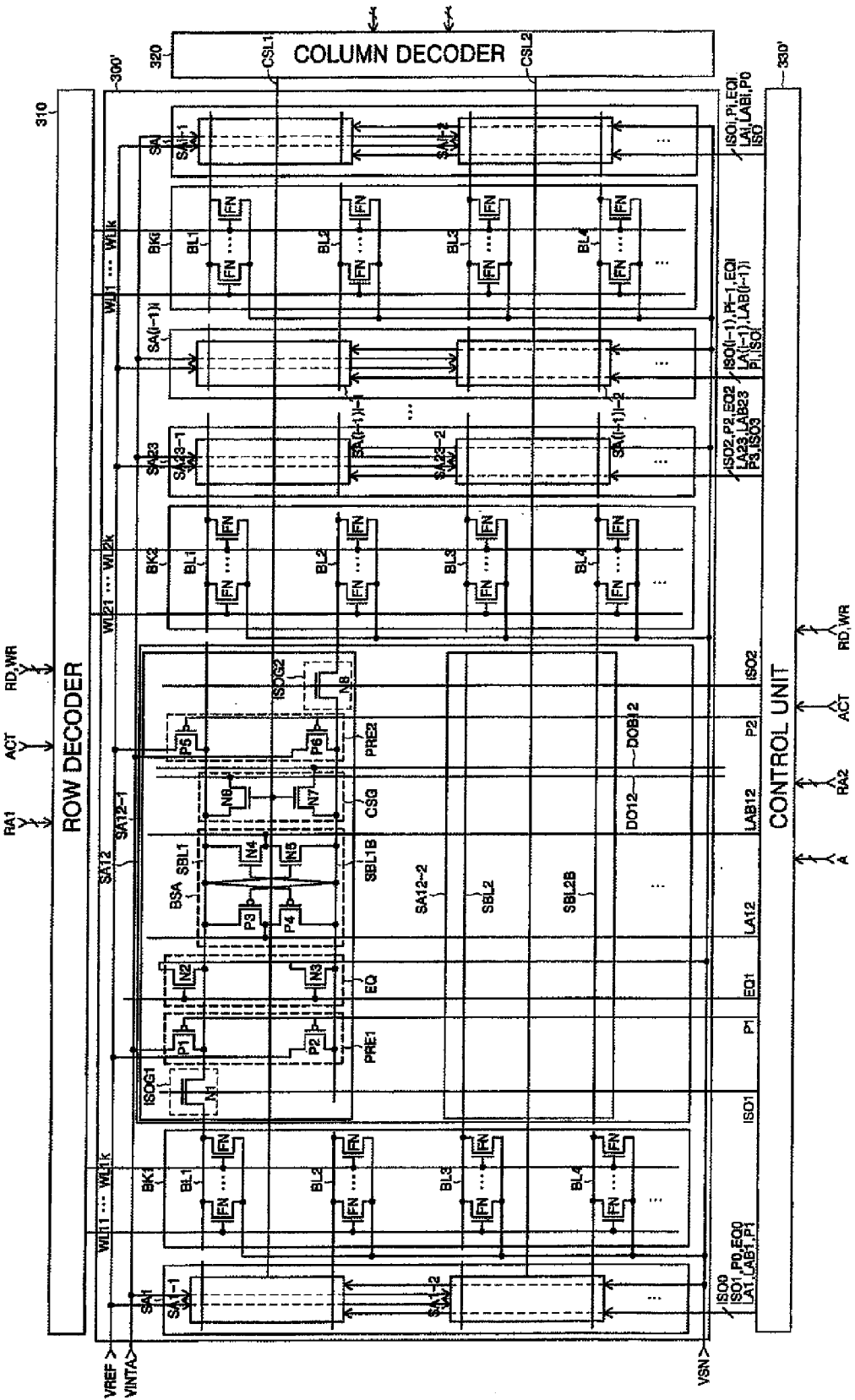

FIG. 6 illustrates the configuration of a semiconductor memory device in accordance with another embodiment of the invention. The semiconductor memory device of FIG. 6 comprises a memory cell array 300' and a control unit 330' rather than memory cell array 300 and control unit 330 of the semiconductor memory device illustrated in FIG. 5, respectively.

Memory cell array 300' comprises sensing blocks SA1, SA12, SA23, . . . , SAi. Each of sensing blocks SA1 to SAi comprises a plurality of sense amplifying units. For example, sensing block SA1 comprises sense amplifying units (SA1-1, SA1-2, . . . ), and sensing block SAi comprises sense amplifying units (SAi-1, SAi-2, . . . ). Each sense amplifying unit comprises bit line isolation gates ISOG1 and ISOG2, a bit line sense amplifier BSA, a column select gate CSG, precharge circuits PRE1 and PRE2, and an equalization circuit EQ. Although they are not all illustrated in detail, each of the sense amplifying units of the semiconductor memory device illustrated in FIG. 6 is substantially the same. Bit line isolation gate ISOG1 comprises an NMOS transistor N1, and bit line isolation gate ISOG2 comprises an NMOS transistor N8. Bit line sense amplifier BSA, precharge circuits PRE1 and PRE2, column select gate CSG, and equalization circuit EQ have the same configuration as the corresponding components of the semiconductor memory device of FIG. 5. The memory cell array blocks BK1 to BKi of FIG. 6 have a configuration similar to that of the memory cell array blocks BK1 to BKi of FIG. 5, except that, in the semiconductor memory device illustrated in FIG. 6, bit lines BL1, BL2, BL3, BL4, . . . are arranged in an open bit line structure.

Functions of blocks illustrated in FIG. 6 will now be described.

Memory cell array 300' has a different configuration than memory cell array 300 of FIG. 5, but data can be written to and read from a memory cell connected between a selected word line and a bit line selected by a column select signal in a manner similar to the way in which data is written to and read from a memory cell in memory cell array 300 of FIG. 5. The function of memory cell array blocks BK1 to BKi of the semiconductor device illustrated in FIG. 6 is similar to the function of memory cell array blocks BK1 to BKi of the semiconductor device illustrated in FIG. 5. Row decoder 310 and column decoder 320 of the semiconductor device illustrated in FIG. 6 function in the same way as row decoder 310 and column decoder 320 of the semiconductor device illustrated in FIG. 5. When an active command ACT is applied, control unit 330' generates bit line isolation control signals ISO0 to ISOi, sense enable control signal pairs (LA1, LAB1), (LA12, LAB12), (LA23, LAB23), . . . , (LAi, LABi), equalization control signals EQ0 to EQi, and precharge control signals P0 to Pi in response to a second row address RA2 specifying a selected memory cell array block BKe from among memory cell array blocks BK1 to BKi and a sensing block selection address signal A specifying either a sensing block disposed on the left side of selected memory cell array block BKe or a sensing block disposed on the right side of selected memory cell array block BKe. By specifying a sensing block disposed on the right or left side of selection memory cell array block BKe, sensing block selection address signal A selects either odd bit lines or even bit lines.

During a write operation or a read operation in the embodiment illustrated in FIG. 6, when memory cell array block BK1 and even bit lines are specified, sensing block SA12 disposed on the right side of memory cell array block BK1 does not perform a sensing operation, while sensing block SA1 disposed on the left side of the memory cell array block BK1 performs a sensing operation. While sensing block SA1 performs a sensing operation, the respective voltages apparent on bit lines and sense bit lines corresponding to sensing block SA12 are maintained at equalization voltage level VSN at which they were set during the equalization operation. Thus, coupling noise caused by coupling capacitance between adjacent bit lines may be reduced.

Although embodiments of the invention have been described above in relation to semiconductor memory devices having dynamic memory cells, a semiconductor memory device in accordance with an embodiment of the invention may have memory cells that are not dynamic memory cells, such as, for example, phase change or magnetic random access memory cells.

In accordance with embodiments of the invention, in a semiconductor memory device and a method of operating the semiconductor memory device, when a sensing block disposed on the right side of a selected memory cell array block performs a sensing operation, a sensing block disposed on the left side of the selected memory cell array block does not perform a sensing operation. Likewise, when a sensing block disposed on the left side of a selected memory cell array block performs a sensing operation, a sensing block disposed on the right side of the selected memory cell array block does not perform a sensing operation. Thus, coupling noise caused by coupling capacitance between adjacent bit lines can be reduced, so data errors occurring during a write operation or read operation may be prevented.

Although embodiments of the invention have been described herein, various changes may be made to those embodiments by one of ordinary skill in the art without departing from the scope of the invention as set forth in the accompanying claims.

What is claimed is:

1. A semiconductor memory device comprising:
    a memory cell array block comprising a plurality of first memory cells connected to a plurality of first bit lines and a plurality of second memory cells connected to a plurality of second bit lines;
    a first sensing block disposed on a first side of the memory cell array block, wherein, when enabled, the first sensing block performs a first sensing operation to amplify a voltage difference between a pair of the first bit lines and between a pair of second bit lines corresponding to the pair of the first bit lines;
    a second sensing block disposed on a second side of the memory cell array block, wherein, when enabled, the second sensing block performs a second sensing operation to amplify a voltage difference between a pair of the second bit lines and between a pair of second sense bit lines corresponding to the pair of second bit lines; and,
    a control unit receiving a sensing block selection address signal, wherein, when the sensing block selection address signal specifies the first sensing block, the control unit enables the first sensing block and disables the second sensing block.

2. The semiconductor memory device of claim 1, wherein, when the sensing block selection address signal specifies the second sensing block, the control unit enables the second sensing block and disables the first sensing block.

3. The device of claim 1, wherein:
    the first and second bit lines are arranged in a folded bit line structure;
    each of the first bit lines is disposed adjacent to one of the second bit lines; and,
    each of the second bit lines is disposed adjacent to one of the first bit lines.

4. The device of claim 1, wherein:
    the plurality of first bit lines and the plurality of second bit lines are arranged in an open bit line structure;
    each of the first bit lines is disposed adjacent to one of the second bit lines; and,
    each of the second bit lines is disposed adjacent to one of the first bit lines.

5. The device of claim 1, wherein each of the first memory cells and each of the second memory cells is a dynamic memory cell comprising a capacitor.

6. The device of claim 1, wherein each of the first memory cells and each of the second memory cells is a dynamic memory cell comprising a transistor having a floating body, and not comprising a capacitor.

7. The device of claim 1, wherein:
    the first sensing block comprises:
    a first precharging unit precharging the pair of first bit lines and the first sense bit line pair to a precharge voltage level during a precharge operation; and,
    a first bit line sense amplifier performing the first sensing operation; and,
    the second sensing block comprises:
    a second precharging unit precharging the pair of second bit lines and the pair of second sense bit lines to the precharge voltage level during a precharge operation; and,
    a second bit line sense amplifier performing the second sensing operation.

8. A semiconductor memory device comprising:
    a plurality of sensing blocks;
    a plurality of memory cell array blocks respectively disposed between pairs of adjacent sensing blocks of the plurality of sensing blocks, wherein each memory cell array block comprises a plurality of first memory cells connected to a plurality of first bit lines and a plurality of second memory cells connected to a plurality of second bit lines; and,
    a control unit receiving a sensing block selection address signal,
    wherein:
    the plurality of sensing blocks comprises a first sensing block disposed on a first side of a selected memory cell array block of the plurality of memory cell array blocks and a second sensing block disposed on a second side of the selected memory cell array block;
    when the sensing block selection address signal specifies the first sensing block, the control unit enables the first sensing block and disables the second sensing block;
    the first sensing block is connected to the first memory cells of the selected memory cell array block; and,
    the second sensing block is connected to the second memory cells of the selected memory cell array block.

9. The device of claim 8, wherein, when the sensing block selection address signal specifies the second sensing block, the control unit enables the second sensing block and disables the first sensing block.

10. The device of claim 8, wherein:
    when the first sensing block is enabled, the first sensing block performs a first sensing operation to amplify a voltage difference between a pair of the first bit lines and between a pair of first sense bit lines corresponding to the pair of the first bit lines; and, when the second sensing block is enabled, the second sensing block performs a second sensing operation to amplify a voltage difference between a pair of the second bit lines and between a pair of second sense bit lines corresponding to the plurality of second bit lines.

11. The device of claim 8, wherein:
the first and second bit lines are arranged in a folded bit line structure;
each first bit line is disposed adjacent to one of the second bit lines; and,
each second bit line is disposed adjacent to one of the first bit lines.

12. The device of claim 8, wherein:
the first and second bit lines are arranged in an open bit line structure;
each of the first bit lines is disposed adjacent to one of the second bit lines; and,
each of the second bit lines is disposed adjacent one of the first bit lines.

13. The device of claim 8, wherein the first memory cells and each of the second memory cells is a dynamic memory cell comprising a capacitor.

14. The device of claim 8, wherein each of the first memory cells and each of the second memory cells is a dynamic memory cell comprising a transistor having a floating body, and not comprising a capacitor.

15. The device of claim 8, wherein:
the control unit enables a precharge control signal applied to the plurality of sensing blocks during a precharge operation; and,
the control unit enables sense amplifier enable signals applied to the first sensing block to enable the first sensing block.

16. The device of claim 15, wherein:
each of the first sensing blocks comprises:
a first precharging unit precharging a pair of first bit lines and a first sense bit line pair corresponding to the pair of first bit lines to a precharge voltage level in response to the precharge control signal; and,
a first bit line sense amplifier performing a first sensing operation to amplify data on the pair of first bit lines and the first sense bit line pair in response to the sense amplifier enable signals; and,
each of the second sensing blocks comprises:
a second precharging unit precharging a pair of second bit lines and a second sense bit line pair corresponding to the pair of second bit lines to the precharge voltage level in response to the precharge control signal; and,
a second bit line sense amplifier performing a second sensing operation to amplify data on the pair of second bit lines and the second sense bit line pair in response to sense amplifier enable signals applied to the second sensing block to enable the second sensing block.

17. A method for operating a semiconductor memory device comprising a memory cell array block, wherein the memory cell array block comprises a plurality of first memory cells connected to a plurality of first bit lines and a plurality of second memory cells connected to a plurality of second bit lines, the method comprising:
disabling a first sensing block corresponding to the first bit lines and disposed on a first side of the memory cell array block to prevent the first sensing block from performing a first sensing operation for any of the first bit lines; and,
enabling a second sensing block corresponding to the second bit lines and disposed on a second side of the memory cell array block to perform a second sensing operation for at least one of the second bit lines while the first sensing block is disabled.

18. The method of claim 17, further comprising, prior to performing the first sensing operation, precharging the plurality of first bit lines and the plurality of second bit lines to a precharge voltage level.

19. The method of claim 17, wherein:
the first and second bit lines are arranged in a folded bit line structure;
each of the first bit lines is disposed adjacent to one of the second bit lines; and,
each of the second bit lines is disposed adjacent to one of the first bit lines.

20. The method of claim 17, wherein:
the first and second bit lines are arranged in an open bit line structure;
each of the first bit lines is disposed adjacent to one of the second bit lines; and,
each of the second bit lines is disposed adjacent to one of the first bit lines.

21. The method of claim 17, wherein each of the plurality of memory cells is a dynamic memory cell comprising a capacitor.

22. The method of claim 17, wherein each of the plurality of memory cells is a dynamic memory cell comprising a transistor having a floating body, and comprising no capacitor.

* * * * *